United States Patent [19]

Matrick

[11] Patent Number: 4,546,072

[45] Date of Patent: Oct. 8, 1985

[54] TONERS TREATED WITH POLYMERIC QUATERNARY AMMONIUM SALTS AND SLIP AGENT

[75] Inventor: Howard Matrick, Highlands, N.J.

[73] Assignee: E. I. Du Pont de Nemours and Company, Wilmington, Del.

[21] Appl. No.: 595,361

[22] Filed: Mar. 30, 1984

[51] Int. Cl.[4] .............................................. G03C 5/04
[52] U.S. Cl. .................................... 430/449; 430/291; 430/965; 430/331
[58] Field of Search ............... 430/109, 110, 449, 291, 430/965, 331

[56] References Cited

U.S. PATENT DOCUMENTS

| | | | |
|---|---|---|---|
| 4,224,396 | 9/1980 | Pollet | 430/107 |
| 4,345,015 | 8/1982 | Hendriksma et al. | 430/110 |
| 4,397,941 | 8/1983 | Fickes | 430/110 |
| 4,430,409 | 2/1984 | Matsumoto et al. | 430/110 |

*Primary Examiner*—John L. Goodrow

[57] ABSTRACT

Dry nonelectroscopic toner comprising pigmented organic resin particles having a size distribution of 0.2 to 30 micrometers, surface coated with at least 0.1% by weight of silicone oil or fluorocarbon compound, in combination with at least 0.5% by weight of a water soluble, polymeric quaternary ammonium compound as defined. The toner is useful in color developing positive- and negative-working photosensitive elements. The toners, particularly magenta and cyan, exhibit high density and excellent stability.

10 Claims, No Drawings

TONERS TREATED WITH POLYMERIC QUATERNARY AMMONIUM SALTS AND SLIP AGENT

DESCRIPTION

TECHNICAL FIELD

This invention relates to dry nonelectroscopic toners. More particularly this invention relates to dry nonelectroscopic toners comprising pigmented organic resin particles surface coated with a slip agent and a water soluble, polymeric quaternary ammonium compound.

BACKGROUND ART

Reproduction processes are known wherein positive-working photopolymerizable elements and negative-working photosensitive elements are exposed imagewise through an original forming nontacky and tacky image areas. Positive-working photopolymerizable elements are described in Chu and Cohen U.S. Pat. No. 3,649,268 and negative-working photosensitive elements are described in Cohen and Fan U.S. Pat. Nos. 4,174,216 and 4,191,572. The image is developed by toning with a suitable toner which desirably adheres only in the tacky image areas. Excess toner which may be present is removed from the nontacky areas to provide, for example, an image which is a proof of the original of which can be used to transfer the image to another surface. Multilayer proofs such as surprint proofs can be made as well.

In view of the increasing importance of proof-making in the printing industry and the problems inherent therein, improved toners and applicators for applying these toners are desirable. Some recognized improvements in toners are those described in Chu and Manger U.S. Pat. No. 3,620,726, mixtures using these toners described in Gray U.S. Pat. No. 3,909,282 and the toners of Manger, Fickes and Long described in U.S. Pat. No. 4,215,193. From the early use of pads dipped in toners, improved toner applicators are the subject of Sandner U.S. Pat. No. 4,019,821 (hand operated toning) and Tobias U.S. Pat. No. 4,069,791 (automatic toning). Application of any of the above described toners as well as known prior art toners to tacky image areas of phtosensitive elements has the problem that the background color resulting from the toners is difficult to completely remove from the nontacky areas of the said elements. Generally an attempt is made to remove the excess toner from the nontacky areas by means of mechanical action using a cloth, brush or other toner removal means. It is known that static is generated by rubbing dissimilar materials together. Depending on the particular film being toned and the toner removal means, the amount of static formed varies. For example, cleaning brushes closest to the film in the triboelectric table would be expected to generate a relatively low charge. Thus it would be expected that an acrylic brush would generate only a small charge with respect to an element that contains an acrylic compound in its photosensitive layer. The toner, however, can also generate a charge against the brush (or cleaning means) and the photosensitive element. If the toner, cleaning means and element have an identical place in the triboelectric table substantially no static charge would be generated. Such a system, while desirable, is not generally achieved. Despite the aforementioned disadvantage the removal of background color in the nontacky areas is desirable. In manual applications this is time consuming. Cleaning operation in a machine increases the cost thereof. After clean-up, some undesirable stain is usually present in the nontacky areas. The term "background color" as used herein is the color present in the nontacky background areas of an exposed and toned positive-working or negative-working photosensitive element prior to any step being taken to remove toner therefrom. Background color is the sum of two components: "stain" which as used herein is the color which is normally not capable of being removed from the background color areas by exhaustive wiping of the areas, and "clean-up" which as used herein is the color which is normally capable of being removed from the background color areas, e.g., by wiping, air impingement, etc.

Dry nonelectrosopic toners comprising pigmented organic resin particles have been developed which provide good clean-up and are substantially nonstaining in the nontacky areas of the photosensitive elements used to prepare multilayer proofs. Such toners have been surface treated with at least 0.5% by weight of a slip agent, e.g., silicone oil having a weight average molecular weight of about 230 to 50,000; saturated hydrocarbons having a weight average molecular weight of about 200 to 10,000; or fluorocarbon compounds having a weight average molecular weight of about 500 to 500,000, in combination with at least 1% by weight of a defined antistatic agent. The dry nonelectroscopic toner particles are described in Fickes U.S. Pat. No. 4,397,941. The optical density of some toners, e.g., magenta, cyan, tends to be below the density required for prepress proofs. In addition, upon aging the toner, the toned density does not remain stable from proof to proof.

It is desired to provide dry, nonelectroscopic toner particles which when surface coated have clean-up qualities and nonstaining of the nontacky areas of photosensitive elements of quality comparable to known dry nonelectroscopic toner particles and possess high density, particularly on magenta and cyan toners, and excellent density and background color aging stability.

DISCLOSURE OF THE INVENTION

In accordance with this invention there is provided a dry nonelectroscopic toner comprising pigmented organic resin particles having a size distribution within the range of 0.2 to 30 micrometers, the improvement whereby the pigmented particles are surface coated with at least 0.1% by weight of slip agent selected from the class consisting of silicone oil having a weight average molecular weight of about 230 to 50,000 and a fluorocarbon compound having a weight average molecular weight of 500 to 500,000, in combination with at least 0.5% by weight of a water soluble, polymeric quaternary ammonium compound selected from the class consisting of

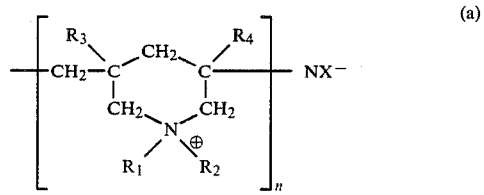

wherein $R_1$ and $R_2$ are independently selected from alkyl groups of 1 to 4 carbon atoms, $R_3$ and $R_4$ are independently selected from H or CH₃, n is a number from 100 to 50,000, and X is a water-solubilizing anion;

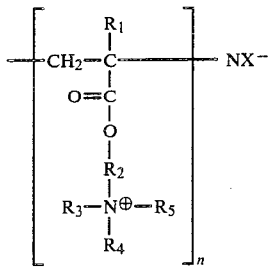
(b)

where $R_1$ is H or CH₃; $R_2$ is $C_xH_{2x}$ where x=2-18; $R_3$ and $R_4$ are $C_xH_{2x+1}$ where x=1-4; $R_5$ is the same as $R_3$ or $\phi$-CH₂; X is a water-solubilizing anion; and n is 50 to 20,000;

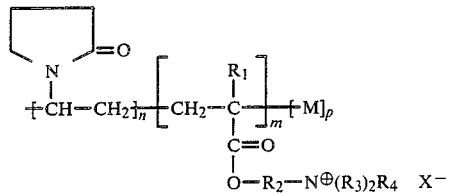
(c)

where n is 40 to 90 mole percent, m is 5 to 40 mole percent, p is 0 to 50 mole percent, and n+m+p=100; $R_1$ is H or CH₃; $R_2$ is $C_xH_{2x}$ where x=1 to 18; $R_3$ is CH₃ or CH₂CH₃; $R_4$ is CH₃, CH₂CH₃ or $\phi$-CH₂; X is a water-solubilizing anion and M is a vinyl monomer unit resulting from the heteropolymerization employing an optional monovinyl nonhydroxy-containing monomer different from and copolymerizable with the m or n units and a weight average molecular weight of 10,000 to 1,000,000.

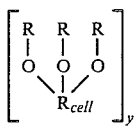
(d)

where $R_{cell}$ is a residue of an anhydroglucose unit from cellulose (C₆H₁₀O₅), methyl cellulose, ethyl cellulose, hydroxyethylcellulose, or hydroxypropyl methyl cellulose; y is the degree of polymerization of 50-20,000 or more; and R may be the same or different and is:

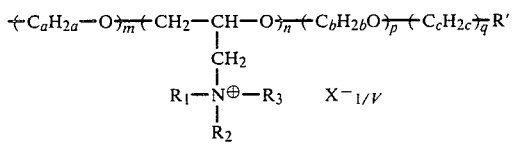

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may be equal to or different from p; R' is a member of a group consisting of H, COOH, COONa, COOK, COONH₄ with the proviso that when q is zero, R' is H; $R_1$, $R_2$ and $R_3$ taken individually represent a member selected from a group consisting of alkyl, aryl, aralkyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ are taken together the nitrogen atom to which $R_1$, $R_2$ and $R_3$ are attached can be a component of a heterocyclic ring selected from a group consisting of pyridine, alpha-methyl pyridine, 2,5-dimethyl pyridine; 2,4,6-trimethyl pyridine, N-methylpiperidine, N-ethylpiperidine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of m+p+q per anhydroglucose unit of said cellulose ether is from about 0.01 to about 4; and (e) copolymer of hydroxyethyl cellulose and diallyldimethyl ammonium chloride.

The improved dry toners of this invention are nonelectroscopic toners comprising pigmented organic resin particles having a size distribution within the range disclosed above. Nonelectroscopic means that the toners are neither repelled from nor attracted to a charged rod when placed in close proximity to the particles. The lower propensity of the toners of the invention to stain nontacky areas and the ease with which the toners can be removed from such areas as well as the high density and stability upon aging are largely attributed to the surface of the toner particles being coated with the combination of the slip agent and the polymeric quaternary ammonium compounds, both of which are more fully described below.

The pigmented organic resin particles are described in Chu and Manger U.S. Pat. No. 3,620,726. Resin matrices include, e.g., polyvinyl chloride, cellulose acetate, cellulose acetate butyrate, polystyrene, polymethyl methacrylate. Also useful are water soluble polymer matrices, e.g., polyvinyl alcohol, methyl cellulose, carboxymethyl cellulose, the particular matrix being used depending on the mechanical means of processing the toner down to the desired effective particle size distribution. For the purpose of determining whether such a particle has the preferred particle size distribution these particles can be measured, for example, by a Coulter Counter, Coulter Electronics, Inc., Hialeah, Fla. The term "particle size" as used herein with respect to the toners covers the size distribution of the smallest, independently acting wnit which is called upon to discriminate between the exposed and unexposed areas of the imaging element. The pigmented portion of the toners include: Monastral ® Blue G (C.I. Pigment Blue 15 C.I. No. 74160), Toluidine Red Y (C.I. Pigment Red 3), Quindo ® Magenta (Pigment Red 122), Indo ® Brilliant Scarlet Toner (Pigment Red 123, C.I. No. 71145), Toluidine Red B (C.I. Pigment Red 3), Watchung ® Red B (C.I. Pigment Red 48), Permanent Rubine F6B13-1731 (Pigment Red 184), Hansa ® Yellow (Pigment Yellow 98), Dalamar ® Yellow (Pigment Yellow 74, C.I. No. 11741), Toluidine Yellow G (C.I. Pigment Yellow 1), Monastral ® Blue B (C.I. Pigment Blue 15), Monastral ® Green B (C.I. Pigment Green 7), Pigment Scarlet (C.I. Pigment Red 60), Auric Brown (C.I. Pigment Brown 6), Monastral ® Green G (Pigment Green 7), Carbon Black, Sterling NS N 774 (Pigment Black 7, C.I. No. 77266), etc.

Slip agents which are useful for coating the particulate toner surface are selected from the group consisting of silicone oil having a weight average molecular weight of about 230 to 50,000; and fluorocarbon compounds having a weight average molecular weight of 500 to 500,000.

Silicone oils useful in the invention include: polydimethylsiloxane (compound 7 in the examples below) and polymethyl (R) siloxane where R is an alkyl chain with 2 to 12 carbon atoms, e.g., ethyl to dodecyl.

Fluorinated hydrocarbons useful in the invention include: fluorocarbon oil, e.g., a polymer of $(CF_2CFCl)_x$ where x is 6 to 10, average molecular weight 965, viscosity at 38° C. is 2740 cp, viscosity at 71° C. is 160 cp; pour point is 21° C. (Fluorolube ® Hooker Chemical Co., Niagara Falls, N.Y.), and polytetrafluoroethylene compound of the formula $[CF_2—CF_2]_x$ where x is a number of 6 to 10.

Silicone oil is the preferred slip agent. The slip agent when a liquid at normal room temperature is a nonsolvent for the toner, is nonvolatile, and is stable to aerial oxidation.

Water soluble, polymeric quaternary ammonium compounds designated Liquid Additive in the Tables and examples below which are useful for coating the particulate toner surface in cooperation with the above described slip agents are selected from the class consisting of

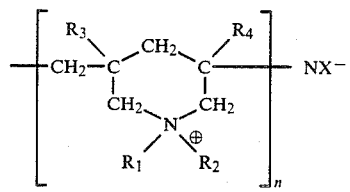
(a)

wherein $R_1$ and $R_2$ are independently selected from alkyl groups of 1 to 4 carbon atoms, $R_3$ and $R_4$ are independently selected from H or $CH_3$, n is a number from 100 to 50,000, and X is a water-solubilizing anion; e.g. chlorine, fluorine, etc.

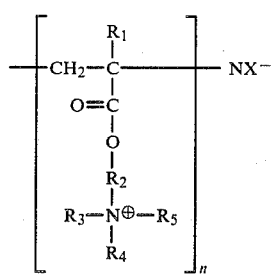
(b)

where $R_1$ is H or $CH_3$; $R_2$ is $C_xH_{2x}$ where x is 2 to 18, preferably 2 to 8; $R_3$ and $R_4$ are $C_xH_{2x+1}$ where x is 1 to 4; $R_5$ is the same as $R_3$ or $\phi$-$CH_2$; X is a water-solubilizing anion, e.g., Cl, Br, I, $SO_4$, $HSO_4$, $C_xH_{2x+1}OSO_3$ where x is 1 to 4; and n is 50 to 20,000;

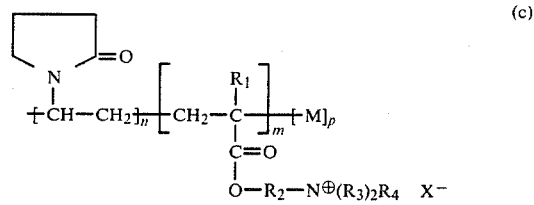
(c)

where n is 40 to 90 mole percent, m is 5 to 40 mole percent, p is 0 to 50 mole percent, and n+m+p equal 100; $R_1$ is H or $CH_3$; $R_2$ is $C_xH_{2x}$ where x is 1 to 18; $R_3$ is $CH_3$ or $CH_2CH_3$; $R_4$ is $CH_3$, $CH_2CH_3$, or $\phi$-$CH_2$; X is a water-solubilizing anion, e.g., I, Cl, Br, $SO_4$, $HSO_4$, $CH_3OSO_3$, $CH_3CH_2OSO_3$ and M is a vinyl monomer unit resulting from the heteropolymerization employing an optional monovinyl nonhydroxy-containing monomer different from and copolymerizable with the m or n units and a weight average molecular weight of 10,000 to 1,000,000;

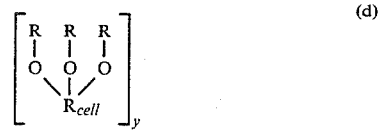
(d)

where $R_{cell}$ is a residue of an anhydroglucose unit from cellulose ($C_6H_{10}O_5$), methyl cellulose, ethyl cellulose, hydroxyethylcellulose or hydroxypropyl methyl cellulose; y is the degree of polymerization of 50–20,000 or more; and R may be the same or different and is:

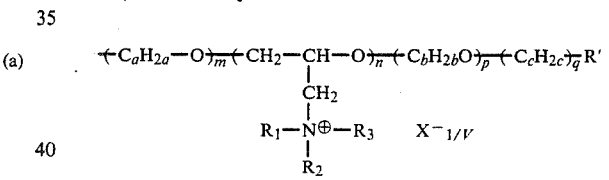

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may be equal to or different from p; R' is a member of a group consisting of H, COOH, COONa, COOK, COONH$_4$ with the proviso that when q is zero, R' is H; $R_1$, $R_2$ and $R_3$ taken individually represent a member selected from a group consisting of alkyl, aryl, aralkyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ are taken together the nitrogen atom to which $R_1$, $R_2$ and $R_3$ are attached can be a component of a heterocyclic ring selected from a group consisting of pyridine, alpha-methyl pyridine, 2,5-dimethyl pyridine; 2,4,6-trimethyl pyridine, N-methylpiperidine, N-ethylpiperidine, N-methyl morpholine and N-ethyl morpholine; X is a water-solubilzing anion, and V is an integer equal to the valence of X; the average value of n per anhydroglucose unit of said cellulose ether is from about 0.01 to about 1, and the average value of m+p+q per anhydroglucose unit of said cellulose ether is from about 0.01 to about 4; and (e) copolymer of hydroxyethyl cellulose and diallyldimethyl ammonium chloride.

Water soluble, polymeric quaternary ammonium compounds of the types described above are disclosed in the following United States patents.

(a) Hoover and Carothers U.S. Pat. No. 3,490,938;
(b) Restaino U.S. Pat. No. 3,926,756 and Phalangas U.S. Pat. No. 3,948,740;
(c) Barabas and Filn U.S. Pat. No. 3,910,862; and
(d) Stone and Rutherford U.S. Pat. No. 3,472,840.

The most preferred water soluble, polymeric quaternary ammonium compound is liquid additive 1, i.e., an aqueous solution of poly(dimethyl diallyl ammonium chloride) which falls in class (a) above. Preferred water soluble polymeric quaternary ammonium compounds added from aqueous solutions for classes (b), (c) and (d) defined above are:

class (b), N,N,N-trimethyl-2-[2-methyl-1-oxo-2-propenyl)oxy]-methyl sulfate;

class (c) copolymer of vinyl pyrrolidone and dimethyl aminoethylmethacrylate quaternized with dimethyl sulfate;

class (d) polymeric quaternary ammonium salt of hydroxyethyl cellulose reacted with a trimethyl ammonium substituted epoxide.

The polymeric quaternary ammonium compound is coated on the surface of the particulate toner in amounts of at least 0.5% by weight up to about 20% by weight. A preferred range for the polymeric quaternary ammonium compound is 3 to 12% by weight. The slip agent is coated on the toner surface in an amount of at least 0.1% by weight up to about 25% by weight. A preferred range of the slip agent is 0.3 to 15% by weight. The above preferred ranges have been found particularly effective when the toners are applied to tacky image areas of photosensitive elements using a modified automatic toning apparatus as described in Tobias U.S. Pat. No. 4,069,791, which is incorporated herein by reference. If the amount of polymeric quaternary ammonium compound and slip agent exceed the maximum amounts good clean-up is achieved in nontacky image areas but another problem may occur. It has been found that pick-off of the toner in the toned image areas may occur. Pick-off is defined as low adhesion of a toner to tacky areas such that when a photoimageable element is applied over the toned image it does not adhere well to the previously toned image area (so that when the cover sheet of the element is removed areas of the layer above the toned area come off with the cover sheet, taking with it some of the applied toner).

The toner particles can be made as illustrated in the examples. The polymeric quaternary ammonium compound and slip agent can be coated in either order or simultaneously on the surface of the pigmented resin particles. It has been found, however, that the particular blender or mixing equipment used may have a bearing on the order in which the coatings occur on the pigmented resin particles. For example, when a Patterson Kelley Twin Shell Blender manufactured by Patterson Kelley Co., Division of Harsco Corp., East Stroudsburg, PA or a Hobart H-600 Mixer manufactured by the Hobart Corp., Troy, Ohio is used it is advantageous to add the polymeric quaternary ammonium compound followed by the slip agent. When the mixing (coating) is accomplished in a Red Devil #30, 5400 Paint Conditioner Model MKI-R, Red Devil, Inc., Union, N.J. or other equivalent type of mixer, the slip agent and polymeric quaternary ammonium compound can be added in either order or simultaneously. Other comparable milling devices can be used. The blending or mixing is carried out for at least five minutes up to 30 minutes or longer after each addition. After blending or mixing, the particles are permitted to dry or can be dried at elevated temperature, e.g., 60° to 150° C.

The static charge on the surface-coated toners of the invention can be determined by a test procedure as follows: 50 g of prepared toner together with $12\frac{1}{4}$-inch stainless steel balls are placed in 8 fluid ounce polypropylene jars, O. Berk Company, Linden, NJ, and let stand overnight (at least 16 hours) in a room at low relative humidity (about 20%). After this period the jars containing the toner and balls are hand shaken for 60 seconds. After shaking the tops are removed and the toners are immediately placed on Four Star ®402C bond paper, 25% by weight cotton fiber, Southworth Company, West Springfield, MA 01089, laid on a stainless steel surface which was grounded. The voltage is recorded after a 5 minute pause by means of a Sweeney Static Meter No. 1127 (contains radioactive material) dated 2/74, B. K. Sweeney Manufacturing Co., Denver, Colo. The results achieved with specified silicone-coated magenta toners and a control are set forth in Table 1 wherein the percentages are by weight.

TABLE 1

| Sample | Toner | Liquid Additive; Amt. (%) | Silicone Oil (%) | Voltage |
|---|---|---|---|---|
| 1 | M1[1] | None; 0 | 0 | > +5000 |
| 2 | M1[2] | 1; 5 | 11 | 0* |
| 3 | M1 | 2; 5 | 11 | 0* |
| 4 | M1 | 3; 5 | 11 | 0 |
| 5 | M1 | 4; 5 | 11 | 0* |
| 6 | M1 | 5; 5 | 11 | 0 |
| 7 | M1 | 6; 5 | 11 | 0 |

[1]Control, M1 toner prepared as described in Example 1 below.
[2]M1 toner, samples 2 to 7, prepared and surface coated as described in Example 3 below.
*Static measurement determined after 3 minute pause.

The toners are useful for color development of a surface having imagewise tacky and nontacky areas wherein to the image-bearing surface is applied the nonelectroscopic toners described above, and the toner particles are distributed over the image surface whereby the toner particles become embedded solely in the tacky image areas. The remaining toner particles are physically removed, e.g., by wiping with a suitable cloth or clean-up section of a toning apparatus if one is used. The nontacky areas are left substantially free of the toner particles. The tacky surface is present in (a) a photopolymerizable layer (positive-working wherein the exposed areas become photohardened) (Chu et al. U.S. Pat. No. 3,649,268): (b) in an imagewise exposed photosensitive layer comprising at least one thermoplastic binder and a photosensitive system, consisting essentially of I. at least one dihydropyridine compound of the formula

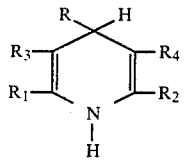

wherein R is alkyl, alkenyl of 3 to 11 carbon atoms, phenylalkyl, phenylalkenyl, unsubstituted aryl of 6 to 10 carbon atoms, and heteroaryl, $R_1$ and $R_2$, which can be the same or different, are alkyl, and $R_3$ and $R_4$, which can be the same or different, are COOR', COR', CN,R' is alkyl; and II. at least one hexaarylbiimidazole compound, (negative-working wherein the exposed area are tacky) (Abele and Grossa U.S. Pat. No. 4,243,741), or (c) in an imagewise exposed element containing nontonable image areas and tacky nonphotosensitive image areas (also negative-working element) (Cohen and Fan U.S. Pat. No. 4,174,216). These patents are incorporated by reference. Other systems known to those skilled in the art can be used provided that tacky and nontacky image areas are formed thereby. The tacky and nontacky image areas in these systems can be formed either directly, e.g., by exposure to actinic radiation or by treatment with solutions, heat or other means to obtain tacky image areas.

The above toned elements can be used to form surprint multicolor proofs by laminating at least one other tonable photoimageable layer over the previously imagewise toned layer as shown in Example 5 below. Each tonable layer is exposed through a different color separation transparency, and the respective layer is colored or developed with toners in a spectral region corresponding to the color separation transparency used for exposure. In most cases four photoimaged toned elements are present in a surprint proof, the toned elements and separation transparencies corresponding respectively to yellow, magenta, cyan and black.

A particularly preferred use involves automatic color development of a surface having imagewise tacky and nontacky areas by dispensing and embedding dry particulate toners on the surface by means of an automatic toning apparatus having a dispenser for dispensing said toner above said surface, and an applicator for embedding said particulate toners in said surface, and means for moving the tacky surface past the dispenser and said applicator, the dispenser includes a hopper having an independently movable side wall, and means to oscillate the side wall laterally of the tacky surface, thereby to supply the particulate material to the surface at a uniform, controlled rate, the improvement wherein the new dry, nonelectroscopic toners described above are automatically dispensed, embedded, and the excess removed (from the nontacky areas).

The toned elements particularly useful in conjunction with the automatic toning apparatus comprise:

1. A supported photopolymer layer having tacky and nontacky areas, solely the tacky image areas being toned with the toners of the invention, and
2. A photopolymer element comprising in order from top to bottom a layer comprising a nontacky photohardenable material with ethylenically unsaturated or benzophenone type groups, a continguous layer of a nonphotosensitive tacky organic material toned imagewise with the toners of the invention, and a support. A preferred mode of the invention is described in Example 2, Sample G.

INDUSTRIAL APPLICABILITY

The dry nonelectroscopic toners are useful for application to positive- or negative-working tacky photosensitive surfaces or tacky nonphotosensitive surfaces in multilayer photosensitive elements which are used to prepare color proofs, e.g., overlays and surprints. The toners are particularly useful in the toning of photosensitive elements useful for the preparation of color proofs in conjunction with a toning apparatus, e.g., automatic toning apparatus described in Tobias U.S. Pat. No. 4,069,791, without the need for a cleanup section. The toners, particularly the magenta and cyan toners, exhibit high density and excellent background color which is substantially retained on aging. The toners are easily prepared and exhibit good toning, and the proofs obtained are substantially stain free in the nontacky areas. The clean up of excess toner is particularly advantageous.

EXAMPLES

This invention is illustrated by the following examples wherein the percentages are by weight. The molecular weights given for the polymers in the photopolymer elements are weight average molecular weights which can be determined by a light scattering technique using known standard samples, e.g., polystyrene, polymethacrylic acid, polymethylmethacrylate, etc., as known to those skilled in the art. The polymeric quaternary ammonium compounds useful for coating the toners of this invention listed in Table 1 above and used in the examples below are designated by numbers as follows:

Polymeric Quaternary Ammonium Compounds (Liquid Additive)

1. Poly(dimethyl diallyl ammonium chloride) (homopolymer) Merquat ®100, Merck Co., Rahway, NJ
2. N,N,N-trimethyl-2-[2-methyl-1-oxo-2-propenyl)oxy]-methylsulfate homopolymer, Reten ®300, Hercules Corp., Wilmington, DE.
3. Copolymer of vinyl pyrrolidone and dimethyl aminoethylmethacrylate quaternized with dimethyl sulfate, Gafquat ®734, GAF Corp., New York, NY.
4. Copolymer of vinyl pyrrolidone and dimethyl aminoethylmethacrylate quaternized with dimethyl sulfate, Gafquat ®755N, GAF Corp., New York, NY.
5. Polymeric quaternary ammonium salt of hydroxyethyl cellulose reacted with a trimethyl ammonium substituted epoxide Ucare TM Polymer JR-125, Union Carbide Corp., Danbury, CT
6. Copolymer of hydroxyethyl cellulose and diallyldimethyl ammonium chloride, Celquat ®L200, National Starch Chemical Corp., Bridgewater, NJ.

Compound 7 is polydimethyl siloxane, silicone oil slip agent, 200-Fluid CS, Dow Corning Co., Midland, MI.

Compounds 8 and 9 are control compounds. Compound 8 is of the formula: $R(OCH_2CH_2)_n$—OH wherein R is an alkyl chain derived from about 50% lauryl ($C_{12}$) and cetyl ($C_{16}$). Compound 9 is a nonpolymeric quaternary ammonium compound of the formula:

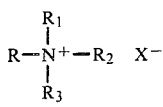

where R is a mixture of cetyl (27%), stearyl (30%) and oleoyl (42%) alkyl chains, $R_1$ is methyl, $R_2$ and $R_3$ are polyether substituents of the formula $-(CH_2CH_2O)_m-[CH_2CH(CH_3)O]_n-H$ where m is 1 and n is 3 and X is an anion $CH_3SO_4$.

Compound 10, another control, is a copolymer of poly(dimethyl diallyl ammonium chloride) and acrylamide (8% solution in water).

The toners of the examples have a size distribution within the range of 0.2 to 30 micrometers, not more than 50% of the particles being less than 1 micrometer particle size by volume as determined by a Coulter Counter Model No. TA 2 using a 50 micriometer aperture.

L*a*b* values set forth in the examples below are calculated using the equations set forth on page 63 under the discussion of 1976 CIE L*a*b* (CIELAB system) in F. W. Billmeyer, Jr. and M. Saltzman "Principles of Color Technology," second edition 1981, pages 62 and 63. After subtracting the L*a*b* values for the area under the stain patch from the L*a*b* values for the unprotected nonreceptive or background areas of the toned photosensitive elements. ΔE is calculated using the following equation:

$$\Delta E = \sqrt{(\Delta L^*)^2 + (\Delta a^*)^2 + (\Delta b^*)^2}$$

The following ingredients were used in the preparation of a magenta toner:

| Ingredient | Amount (g) |
| --- | --- |
| Quindo ® Magenta (Pigment Red 122, Harmon Colors Division, Mobay Chemical Corp., Haledon, NJ) | 4,300 |
| Indo ® Brilliant Scarlet Toner (Pigment Red 123, C.I. No. 71145) | 850 |
| Cellulose acetate | 7,000 |
| Acetone | 27,222 |
| Water | 21,778 |

The water and acetone were thoroughly mixed and were charged to a Type 30-S Attritor stirred and jacketed ball mill (Union Process Co., Akron, OH). This mill contained ⅛ inch (0.049 cm) Type 440 stainless steel balls that were agitated at 150 rpm. A nitrogen atmosphere was maintained in the mill during the mixing procedure. Approximately two-thirds of the weight of the cellulose acetate was then added during a 3- to 5-minute period and was agitated in the liquid for about 2 minutes. The pigment was then added over a 2-minute period followed by the remainder of the cellulose acetate. The mixture was then agitated at about 150 rpm in the mill for about 6 hours at 22° C.; 5 gallons of water were added in 2 minutes followed by agitation for 5 minutes. The mill was drained and washed with water and the combined effluents were filtered to collect the wet toner. The wet toner was water-washed and dried in an oven at 115°–125° C., and the dried toner was pulverized in a pin mill. The particle size distribution of the toner at this point was 0.2 to 30 micrometers. The toner was designated M1.

4540 grams of untreated toner M1 were placed in a Hobart H-600 Mixer (blender), manufactured by the Hobart Corporation, Troy, Ohio and the blender was turned on. 2270 grams of 10% solution of Liquid Additive 1 in water was added to the blender at the rate of 125 grams per minute. After the addition of all the Liquid Additive 1 solution, the ingredients were mixed for 5 minutes followed by the addition of 454 grams of Compound 7, polydimethyl siloxane, at rate of 35 grams/minute. After completion of the addition of Compound 7, mixing was continued for an additional 30 minutes, the blender speed being varied from speed setting 3 (slowest) to speed setting 1 (fastest). The toner was then dried in an oven at 110° C. for 18 hours.

A positive-working photopolymerizable element similar to that described in Example 1. Chu and Cohen U.S. Pat. No. 3,649,268 was prepared having a 0.0003 inch (0.00076 cm) photopolymer layer coated on 0.0005 inch (0.0013 cm) polyethylene terephthalate film support, and covered by a suitable 0.00075 inch (0.0019 cm) polypropylene cover sheet. As described in Example 1 of said U.S. Pat. No. 3,649,268, the cover sheet was removed and the photopolymer layer was laminated to Kromekote ® paper (on cast coated side). A suitable solid test pattern image was exposed on the photopolymer whereby the exposed areas became hardened and the unexposed areas remained tacky. The polyethylene terephthalate film was then removed, a 1.25 inch (~3.15 cm) square self-sticking label was attached to an exposed area of the imaged element, and the image was developed by toning using the toning apparatus described in Tobias U.S. Pat. No. 4,069,791, wherein the hopper has a laterally oscillating sidewall and the cleaning pad was eliminated. The machine was run at 4 ft/min (1.22 m/min). The label protected the exposed, nonreceptive area of the element under it from being contacted with toner particles during the toning step. To obtain equilibrium conditions rapidly the toning pad was first saturated with toner by applying toner on the pad across its width and pressing it with a 1-inch (2.54 cm) wide spatula. The stain patch was removed after toning the element and results indicated in Table 2 were obtained using the process described below.

A negative-working photosensitive element was prepared by laminating in surface-to-surface relationship at room temperature with a pressure of about 40 psi (2.81 kg/dm²) a supported photopolymerizable layer (I) and supported tonable, tacky elastomer contiguous layer (II). Layers I and II are prepared as follows:

I. Nontonable Photopolymerizable Layer

A coating solution of a photopolymerizable composition was prepared by mixing together the following ingredients:

| Ingredient | Weight (g) |
| --- | --- |
| Polymethyl methacrylate (MW 200,000–300,000) | 41.54 |
| Di-(3-acryloxy-2-hydroxypropyl) ether of Bisphenol-A | 51.86 |
| (2-chlorophenyl-4,5-diphenyl imidazolyl) dimer | 2.20 |
| 2-(Stilbyl-4″)-naphtho-1′,2′;4.5)1,2,3-triazol-2″-sulfonic acid phenyl ester | 2.20 |
| 2-Mercaptobenzoxazole | 1.50 |
| Polyethylene oxide (MW 600,000) | 0.70 |

-continued

| Ingredient | Weight (g) |
| --- | --- |
| Methanol | 20.70 |
| Methylene chloride | 323.70 |

This solution was coated at a coating weight of about 40 mg/dm² when dried on a clear polyethylene terephthalate film having a thickness of 0.0005 inch (0.0015 cm) which was surface treated by electrostatic discharge at 0.07 coulombs/ft² (0.093 coulombs/m²).

II. Tonable, Tacky Elastomer Contiguous Layer

A coating solution was prepared by mixing together the following ingredients:

| Ingredient | Weight (g) |
| --- | --- |
| Random copolymer of sytrene/butadiene (40/60) | 19.75 |
| Cis-polybutadiene (Mooney Viscosity 55–60) | 79.75 |
| Tetra-bis[methylene-3-(3',5'-di-t-butyl-4'-)hydroxyphenyl)propionate]methane | 0.50 |
| Methylene chloride to make | 1333.30 |

This solution was coated on polyethylene terephthalate film having a releasable layer of polydimethyl siloxane coated thereon to give a coating weight of about 125 mg/dm² when dried.

The negative-working element was exposed through the electrostatic discharge treated, clear polyethylene terephthalate film for about 30 seconds on a Berkey-Ascor Vacuum Printer exposure device fitted with a photopolymer lamp (2 kW) and a Kokomo glass filter (No. 400) Kokomo Opalescent Glass Co., Kokomo, IN. The distance between the lamp and the vacuum frame of the device was about 38 inches (96.52 cm). After exposure, the exposed element was taped securely to a suitable flat surface, and the clear polyethylene terephthalate cover sheet was stripped by pulling at one corner with an even, continuous motion at an angle of about 135°–180°. The resulting exposed, photopolymerized image adhered to the treated polyethylene terephthalate film and was removed therewith exposing equivalent areas of the contiguous layer (II). The tacky image was developed by toning using the toning apparatus described above. A self-sticking label was attached prior to toning, and removed after toning as described earlier. Results concerning the two elements are shown in Table 2 below.

TABLE 2

|  | L* | a* | b* | $D_{max}$[1] | Lack of Background Color |
| --- | --- | --- | --- | --- | --- |
| Negative Working Film | 46.5 | 68.3 | 6.1 | 1.38 | Excellent |
| Positive working Film | 43.8 | 70.6 | 9.6 | 1.57 | Excellent |

[1] $D_{max}$ was measured using an ACS Spectrosensor, Applied Color Systems, Princeton, NJ

EXAMPLE 2

19.43 kgs of magenta toner (M1) were prepared by the procedure described in Example 1 and divided into nine equal parts. A tenth part of magenta toner (M2) was prepared using the same procedure with the following exceptions: ingredients and the amount of each ingredient outlined below were used:

| Ingredient | Weight (g) |
| --- | --- |
| Quindo ® Magenta (Pigment Red 122, Harmon Colors Division, Mobay Chemical Corp, Haledon, NJ) | 5312 |
| Cellulose acetate | 6470 |
| Acetone | 27676 |
| Water | 22231 |

Each part was surface coated with a Liquid Additive and Compound 7 as indicated in Table 3, the blending being done in a Patterson-Kelley Twin Shell Blender (manufactured by the Patterson-Kelley Company, Division of Harsco Corporation, East Stroudsburg, PA) instead of the Hobart Blender. These toners were used to tone a negative-working element described in Example 1 using the procedure described in that Example. As noted in Table 3 below, when the specific blender of this example is used the first liquid additive should be the polymeric quaternary ammonium compound rather than polydimethyl siloxane (Compound 7).

TABLE 3

| Sample | First Liquid | Amt[1] (g) | 1st Addn Rate (g/min) | Second Liquid | Amt[1] (g) | 2nd Addn Rate (g/min) | L* | a* | b* | $D_{max}$[2] |
| --- | --- | --- | --- | --- | --- | --- | --- | --- | --- | --- |
| A | 1[3,4] | 1135 | 40 | 7 | 227 | 19 | 45.1 | 68.8 | 7.5 | 1.45 |
| B | 7[3,4] | 227 | 20 | 1 | 1135 | 40 | 49.5 | 63.9 | 3.3 | 1.19 |
| C | 2[3,4] | 2270 | 40[6] | 7 | 227 | 20 | 47.5 | 67.6 | 4.8 | 1.33 |
| D | 1[3,4] | 1135 | 40 | 7 | 227 | 20 | 44.2 | 68.8 | 9.2 | 1.49 |
| E | 7[3,4] | 227 | 20 | 1 | 1135 | 40 | 50.0 | 64.2 | 3.0 | 1.18 |
| F | 1[3,4] | 1362 | 40 | 7 | 227 | 20 | 46.1 | 68.4 | 6.2 | 1.39 |
| G | 1[3,4] | 740 | 20 | 7 | 216 | 20 | 44.8 | 68.9 | 7.6 | 1.46 |
| H | 1[3,5] | 740 | 20 | 7 | 216 | 20 | 42.8 | 69.3 | 8.8 | 1.47 |

[1] % active ingredient First Liquid A, D, F all 10; B, E both 100; C 5; G and H both 20; % active ingredient Second Liquid: A, C, D, F, G, H all 100; B, E both 10
[2] $D_{max}$ messured as in Example 1.
[3] Lack of background color - excellent
[4] Toner M1
[5] Toner M2
[6] Treated toner reground

EXAMPLE 3

200 grams of an untreated magenta toner, M1, prepared as described in Example 1, 22.0 g of Compound 7, an amount of a Liquid Additive to give 5% dry weight based on the weight of the untreated toner, and a 9-inch (22.86 cm) stainless steel chain were added to a two-quart Bain Marie container (Le Beau Products, Baraboo, Wis. 53913), with stirring after each additon using a spatula. This mixture was blended 30 minutes on a Red Devil Paint Conditioner, Model MKI-R (Red Devil, Inc., Union, N.J.). The toner was then dried in an oven at 105°–115° for 16 hours.

A negative-working photosensitive element was prepared, exposed and toned as described in Example 1 using the above-described treated toners.

Total background color caused by a combination of poor "clean-up" and "stain" was measured. L*a*b* data was obtained on the area under the stain patch using the ACS Spectrosensor (Applied Color Systems, Princeton, NJ). This value was subtracted from the value obtained in the unprotected, nonreceptive or background areas of the toned element. Ten measurements were made on each toned element:

Two within 1 inch (2.54 cm) of the leading edge of the toned element.

Two in each third of the toned element for a total of six.

Two within 1 inch (2.54 cm) of the trailing edge of the toned element. (This is important since it is often sensitive to poor clean-up). Optical density ($D_{max}$) and average deviation (sigma) were measured on a MacBeth RD918 narrow band Densitometer by averaging a 100/8 inch diameter toned circles. Results are shown in Table 4 below:

TABLE 4

| Liquid Additive (% active ingredient) | $D_{max}$ | Average Deviation (Σ) | (ΔE) Background Color | |
|---|---|---|---|---|
| | | | Full Proof | Trailing Edge |
| 2 (15) | 1.78 | 0.017 | 0.63 | 0.71 |
| 1 (10) | 1.91 | 0.024 | 0.50 | 0.72 |
| 5 (10) | 1.85 | 0.024 | 1.14 | 1.56 |
| 6 (10) | 1.76 | 0.020 | 0.89 | 1.85 |
| 3 (10) | 1.87 | 0.023 | 0.14 | 0.22 |
| 4 (10) | 1.88 | 0.030 | 0.44 | 0.78 |
| 9 (100) Control | 1.58 | 0.012 | 0.24 | 0.20 |
| 8 (100) Control | 1.65 | 0.023 | 2.4 | 10.5 |
| 10 (8) Control | 1.91 | 0.59 | 20.7 | 12.4 |
| None Control | 2.07 | 0.033 | 54.0 | 58.5 |

EXAMPLE 4

The toners prepared as described in Example 3 were aged for 7 days at 75° C. and used to tone negative-working photopolymerizable elements as described in Example 3. Results are shown in Table 5 below:

TABLE 5

| Liquid Additive | $D_{max}$[1] (aged) | Avg. Deviation (Σ) | (ΔE) Background Color | | % Change in Density | Background Color |
|---|---|---|---|---|---|---|
| | | | Full Proof | Trailing Edge | Fresh-aged Fresh | Change (Full Proof) |
| 2 | 1.80 | 0.0026 | 0.25 | 0.25 | −1.1 | −0.38 |
| 1 | 1.85 | 0.018 | 0.68 | 0.51 | +3.1 | +0.18 |
| 5 | 1.82 | 0.025 | 0.54 | 0.79 | −1.6 | −0.60 |
| 6 | 1.75 | 0.024 | 0.32 | 0.33 | −0.6 | −0.57 |
| 3 | 1.79 | 0.039 | 0.21 | 0.19 | −4.3 | +0.07 |
| 4 | 1.82 | 0.021 | 0.31 | 0.34 | −3.2 | −0.13 |
| 9 Control | 1.83 | 0.032 | 0.86 | 0.93 | +15.8 | +0.62 |
| 8 Control | 2.06 | 0.037 | 12.2 | 25.0 | +24.8 | +9.8 |
| 10 Control | 1.90 | 0.0063 | 51.9 | 47.6 | −0.5 | +31.2 |
| None Control | 1.62 | 0.023 | 72.0 | 72.2 | −21.7 | +18.0 |

[1]$D_{max}$ measured as described in Example 3.

EXAMPLE 5

A. The following ingredients were used to prepare a yellow toner:

| Ingredient | Amount (Kg) |
|---|---|
| Hansa ® Yellow (Pigment Yellow 98) | 14.4 |
| Cellulose acetate | 21.6 |
| Acetone | 96.75 |
| Water | 78.75 |

The toner was prepared as described in Example 1. The toner was dried and pulverized as described in Example 1 and is designated Y1.

B. The following ingredients were used to prepare a cyan toner:

| Ingredient | Amount (g) |
|---|---|
| Monastral ® Blue G (Copper Phthalocyanine, Pigment Blue 15 C.I. No. 74160) | 1,728.0 |
| Cellulose acetate | 7,871.0 |
| Acetone | 27,669.6 |
| Water | 22,680.6 |

The toner was prepared as described in Example 1 and is designated C1.

C. The following ingredients were used to prepare a black toner:

| Ingredient | Amount (g) |
|---|---|
| Carbon Black, Sterling NS N774 (Pigment Black 7, C.I. No. 77266) | 6,300.0 |
| Cellulose acetate | 6,300.0 |
| Acetone | 27,669.6 |
| Water | 22,680.6 |

The toner was prepared in the same manner as described in Example 1 and is designated B1.

To 300 grams of the respective untreated toner placed in a two quart Bain Marie container (Le Beau Products, Baraboo, Wis. 53913) were added the appropriate amount of Liquid Additive 1 indicated in Table 6 below, and a 9 inch (22.86 cm) stainless steel chain. After stirring with a spatula, the mixture was blended 30 minutes on a Red Devil Paint Conditioner, Model MKI-R (Red Devil, Inc., Union, NJ), followed by the addition of the appropriate amount of Compound 7 indicated in Table 6. The mixture was then blended for another 20 minutes and dried at 97° C. overnight.

A positive-working photopolymerizable element as described in Example 1, after removal of the cover sheet, was laminated at about 110° C. to the smooth side of Kromekote ® cast-coated one-sided paper, manufactured by Champion Paper and Fiber Company on a fixed-bed transfer machine as described in Chu, Cohen and Tobias U.S. Pat. No. 3,594,535, incorporated by reference. The photopolymer layer was exposed at a distance of about 27 inches (68.6 cm) through a minus-blue separation halftone positive for about 8 seconds using a nuArc ® Plate Maker "Flip Top", Model FT26M-2 carbon arc light source. The polyethylene terephthalate support was removed at room temperature and yellow toner, prepared as described above was applied to the exposed photopolymer surface using the automatic toner apparatus described in Example 1, adapted for 4-toner application. The clean-up and toning quality were good and the stain-free quality was also good. The toner adhered only to those image areas that were not exposed to the radiation.

The cover sheet was removed from a second element as described in Example 1, and the clear photopolymer layer was laminated onto the yellow-toned layer, obtained above, at a temperature of 110° C. The two-layer element was exposed through a minus-green separation halftone positive for about 3 seconds using the light source described above. The base support was stripped from the photopolymer, and a magenta toner, prepared as described in Example 1, was applied to the exposed photopolymer surface at room temperature using the automatic toning apparatus described above. The clean-up, toning quality and stain-free quality were good.

The cover sheet was removed from a third photopolymerizable element coated with the above-described composition and the clear photopolymer layer was laminated onto the magenta-toned layer, obtained above, at a temperature of 110° C. This was exposed through the minus-red halftone positive for about 3 seconds using the light source, described above. The polyethylene terephthalate support was removed from the layer and cyan toner prepared as described above was applied to the exposed photopolymer surface using the automatic toner apparatus described above. The clean-up, toning quality, and stain-free quality were good.

A fourth photopolymerizable layer was laminated onto the cyan-toned layer of the three-layer film base using the same procedure and under the same conditions used in preparing the two previous layers. The fourth layer was exposed through a black printer halftone positive for about 3 seconds using the light source described above. After stripping off the polyethylene terephthalate support, a black toner prepared as described above was applied to the exposed photopolymer surface using the automatic toner apparatus described above. The clean-up, toning quality and stain-free quality were good.

After application of the black toner, a fifth layer of photopolymer was laminated at 110° C. over the four-color halftone positive which simulates closely a press proof.

TABLE 6

| Toner | Liquid Additive/ Compound | Amount Added (%) |
| --- | --- | --- |
| Y1 | 1/7 | 8/11 |
| C1 | 1/7 | 7/8 |
| B1 | 1/7 | 4/10 |
| M1 | 1/7 | 7/9 |

EXAMPLE 6

A cyan toner was prepared as described in Example 1 from the following ingredients:

| Ingredient | Amount (g) |
| --- | --- |
| Monastral ® Blue G (Copper Phthalocyanine, Pigment Blue 15 C.I. No. 74160) | 1,728.0 |
| Cellulose acetate | 7,871.0 |
| Acetone | 27,669.6 |
| Water | 22,680.6 |

The toner is designated C1. To 300 grams of this untreated toner in a two quart Bain Marie container (LeBeau Products, Baraboo, Wis.) were added 24 g (8%) of Compound 7 and a 9 inch (22.86 cm) stainless steel chain. After stirring with a spatula, the mixture was blended 30 minutes on a Red Devil Paint Conditioner, Model MKI-R (Red Devil, Inc., Union, NJ), followed by the addition of 5% of Liquid Additive, identified in Table 7 below. The mixture was then blended for another 30 minutes and dried overnight at 100° C.

The toners treated as described above were used to tone negative-working photopolymerizable elements prepared as described in Example 1. Results are shown in Table 7.

TABLE 7

| Liquid Additive | $D_{max}$[1] | L* | a* | b* | Stain ΔE |
| --- | --- | --- | --- | --- | --- |
| 1[2] | 1.22 | 51.8 | −30.5 | 50.3 | 0.2 |
| 8 (Control) | 1.05 | 55.4 | −29.4 | −47.0 | 0.3 |

[1]$D_{max}$ was measured using ACS spectrosensor (Applied Color Systems, Princeton, NJ)
[2]75 grams of 20% solution The toner of the invention results in a 16.19% increase in $D_{max}$ and slightly improved stain than the element toned with the control toner.

I claim:

1. A dry nonelectroscopic toner comprising pigmented organic resin particles having a size distribution within the range of 0.2 to 30 micrometers, the improvement whereby the pigmented particles are surface coated with at least 0.1% by weight of liquid slip agent selected from the class consisting of silicone oil having a weight average molecular weight of about 230 to 50,000 and a fluorocarbon compound having a weight average molecular weight of 500 to 500,000, in combination with at least 0.5% by weight of a water soluble, polymeric quaternary ammonium compound selected from the class consisting of

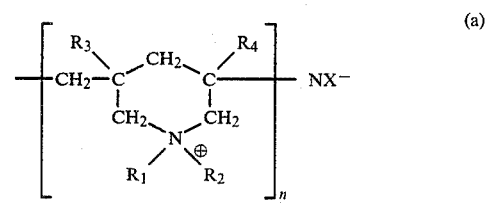

(a)

wherein $R_1$ and $R_2$ are independently selected from alkyl groups of 1 to 4 carbon atoms, $R_3$ and $R_4$ are independently selected from H or $CH_3$, n is a number from 100 to 50,000, and X is a water-solubilizing anion;

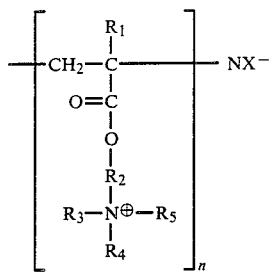

(b)

where $R_1$ is H or $CH_3$; $R_2$ is $C_xH_{2x}$ where $x = 2$–$18$; $R_3$ and $R_4$ are $C_xH_{2x+1}$ where $x = 1$–$4$; $R_5$ is the same as $R_3$ or $\phi$-$CH_2$; X is a water-solubilizing anion; and n is 50 to 20,000;

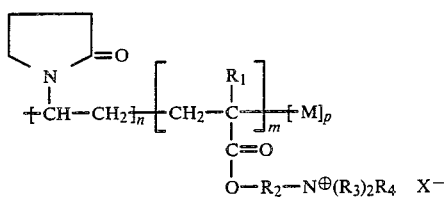

(c)

where n is 40 to 90 mole percent, m is 5 to 40 mole percent, p is 0 to 50 mole percent, and $n + m + p = 100$; $R_1$ is H or $CH_3$; $R_2$ is $C_xH_{2x}$ where $x = 1$ to 18; $R_3$ is $CH_3$ or $CH_2CH_3$; $R_4$ is $CH_3$, $CH_2CH_3$ or $\phi$-$CH_2$; X is a water-solubilizing anion and M is a vinyl monomer unit resulting from the heteropolymerization employing an optional monovinyl nonhydroxy-containing monomer different from and copolymerizable with the m or n units and a weight average molecular weight of 10,000 to 1,000,000.

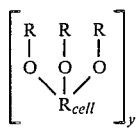

(d)

where $R_{cell}$ is a residue of an anhydroglucose unit from cellulose ($C_6H_{10}O_5$), methyl cellulose, ethyl cellulose, hydroxyethylcellulose, or hydroxypropyl methyl cellulose; y is the degree of polymerization of 50–20,000 or more; and R may be the same or different and is:

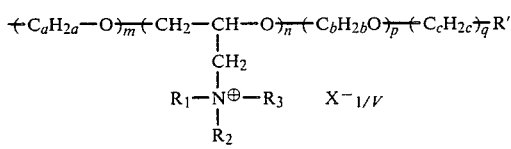

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may be equal to or different from p; R' is a member of a group consisting of H, COOH, COONa, COOK, COONH$_4$ with the proviso that when q is zero, R' is H; $R_1$, $R_2$ and $R_3$ taken individually represent a member selected from a group consisting of alkyl, aryl, aralkyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ are taken together the nitrogen atom to which $R_1$, $R_2$ and $R_3$ are attached can be a component of a heterocyclic ring selected from a group consisting of pyridine, alpha-methyl pyridine, 2,5-dimethyl pyridine; 2,4,6-trimethyl pyridine, N-methylpiperidine, N-ethylpiperidine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of $m+p+q$ per anhydroglucose unit of said cellulose ether is from about 0.01 to about 4; and (e) copolymer of hydroxyethyl cellulose and diallyldimethyl ammonium chloride.

2. A toner according to claim 1 wherein the slip agent is polydimethylsiloxane or polymethyl (R) siloxane where R is an alkyl chain with 2 to 12 carbon atoms.

3. A toner according to claim 1 wherein the water soluble polymeric quaternary ammonium compound is of the formula:

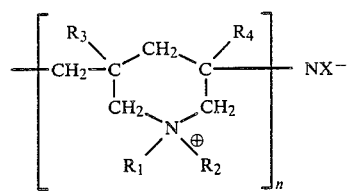

(a)

wherein $R_1$ and $R_2$ are independently selected from alkyl groups of 1 to 4 carbon atoms, $R_3$ and $R_4$ are independently selected from H or $CH_3$, n is a number from 100 to 50,000, and X is a water-solubilizing anion.

4. A toner according to claim 3 wherein the polymeric quaternary ammonium compound is poly(dimethyl diallyl ammonium chloride).

5. A toner according to claim 1 wherein the water soluble polymeric quaternary ammonium compound is of the formula:

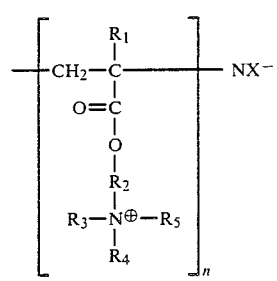

(b)

where $R_1$ is H or $CH_3$; $R_2$ is $C_xH_{2x}$ where $x = 2$–$18$; $R_3$ and $R_4$ are $C_xH_{2x+1}$ where $x = 1$–$4$; $R_5$ is the same as $R_3$ or $\phi$-$CH_2$; X is a water-solubilizing anion; and n is 50 to 20,000.

6. A toner according to claim 5 wherein the polymeric quaternary ammonium compound is N,N,N- trimethyl-2-[2-methyl-1-oxo-2-propenyl)oxy]methylsulfate homopolymer.

7. A toner according to claim 1 wherein the water soluble polymeric quaternary ammonium compound is of the formula:

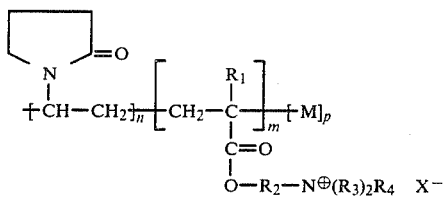

(c)

where n is 40 to 90 mole percent, m is 5 to 40 mole percent, p is 0 to 50 mole percent, and $n+m+p=100$; $R_1$ is H or $CH_3$; $R_2$ is $C_xH_{2x}$ where $x=1$ to 18; $R_3$ is $CH_3$ or $CH_2CH_3$; $R_4$ is $CH_3$, $CH_2CH_3$ or $\phi$-$CH_2$; X is a water-solubilizing anion and M is a vinyl monomer unit resulting from the heteropolymerization employing an optional monovinyl nonhydroxy-containing monomer different from and copolymerizable with the m or n units and a weight average molecular weight of 10,000 to 1,000,000.

8. A toner according to claim 7 wherein the polymeric quaternary ammonium compound is a copolymer of vinyl pyrrolidone and dimethyl aminoethylmethacrylate quaternized with dimethyl sulfate.

9. A toner according to claim 1 wherein the water soluble polymeric quaternary ammonium compound is of the formula:

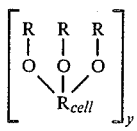

(d)

where $R_{cell}$ is a residue of an anhydroglucose unit from cellulose ($C_6H_{10}O_5$), methyl cellulose, ethyl cellulose, hydroxyethylcellulose, or hydroxypropyl methyl cellulose; y is the degree of polymerization of 50–20,000 or more; and R may be the same or different and is:

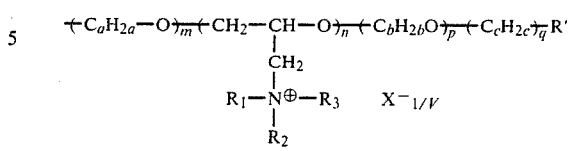

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may be equal to or different from p; R' is a member of a group consisting of H, COOH, COONa, COOK, COONH$_4$ with the proviso that when q is zero, R' is H; $R_1$, $R_2$ and $R_3$ taken individually represent a member selected from a group consisting of alkyl, aryl, aralkyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ are taken together the nitrogen atom to which $R_1$, $R_2$ and $R_3$ are attached can be a component of a heterocyclic ring selected from a group consisting of pyridine, alpha-methyl pyridine, 2,5-dimethyl pyridine; 2,4,6-trimethyl pyridine, N-methylpiperidine, N-ethylpiperidine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of $m+p+q$ per anhydroglucose unit of said cellulose ether is from about 0.01 to about 4.

10. A toner according to claim 9 wherein the polymeric quaternary ammonium compound is a polymeric quaternary ammonium salt of hydroxyethyl cellulose reacted with a trimethyl ammonium substituted epoxide.

* * * * *